(12) United States Patent
Lin et al.

(10) Patent No.: US 6,806,192 B2
(45) Date of Patent: Oct. 19, 2004

(54) METHOD OF BARRIER-LESS INTEGRATION WITH COPPER ALLOY

(75) Inventors: Jing-Cheng Lin, Chu Tung Zhen (TW); Cheng-Lin Huang, Taipei (TW); Ching-Hua Hsieh, Hsinchu (TW); Shau-Lin Shue, Hsinchu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/350,837

(22) Filed: Jan. 24, 2003

(65) Prior Publication Data

US 2004/0147104 A1 Jul. 29, 2004

(51) Int. Cl.[7] .............................................. H01L 21/44
(52) U.S. Cl. ...................... 438/687; 438/618; 438/622; 438/625; 438/638; 438/685; 438/660
(58) Field of Search ................................ 438/598, 627, 438/635, 638, 643, 648, 653, 685, 687, 618, 622, 624, 625, 628, 637, 654, 660, 661

(56) References Cited

U.S. PATENT DOCUMENTS

| | | | |
|---|---|---|---|
| 5,913,144 A | 6/1999 | Nguyen et al. ............. 438/643 |
| 5,968,847 A * | 10/1999 | Ye et al. ...................... 438/734 |
| 6,015,749 A | 1/2000 | Liu et al. ..................... 438/628 |
| 6,043,148 A | 3/2000 | Peng et al. .................. 438/628 |
| 6,130,156 A * | 10/2000 | Havemann et al. ......... 438/637 |
| 6,218,734 B1 | 4/2001 | Charneski et al. .......... 257/751 |
| 6,287,977 B1 * | 9/2001 | Hashim et al. .............. 438/722 |
| 6,291,334 B1 * | 9/2001 | Somekh ...................... 438/620 |
| 6,309,970 B1 | 10/2001 | Ito et al. ...................... 438/687 |
| 6,365,502 B1 | 4/2002 | Paranjpe et al. ............ 438/622 |
| 6,365,506 B1 | 4/2002 | Chang et al. ................ 438/624 |
| 6,387,805 B2 * | 5/2002 | Ding et al. .................. 438/687 |
| 6,498,093 B1 * | 12/2002 | Achuthan et al. ........... 438/643 |
| 6,518,177 B1 * | 2/2003 | Kawanoue et al. ......... 438/653 |
| 6,518,668 B2 * | 2/2003 | Cohen ......................... 257/751 |
| 6,576,555 B2 * | 6/2003 | Tseng .......................... 438/694 |

* cited by examiner

Primary Examiner—Amir Zarabian
Assistant Examiner—Khanh Duong
(74) Attorney, Agent, or Firm—Hayes and Boone, LLP

(57) ABSTRACT

A new method is provided for the creation of a barrier-free copper interconnect. A dual damascene structure is created in a layer of dielectric, a thin metal barrier layer is deposited. The metal barrier layer is oxidized, two layers are then deposited with the first layer comprising doped copper and the second layer comprising pure copper. The dual damascene structure is filled with copper, a thermal anneal is applied, stabilizing the deposited copper filling the dual damascene structure and forming metal oxide of the doped minority element. Excess copper is then removed from the dielectric.

32 Claims, 4 Drawing Sheets

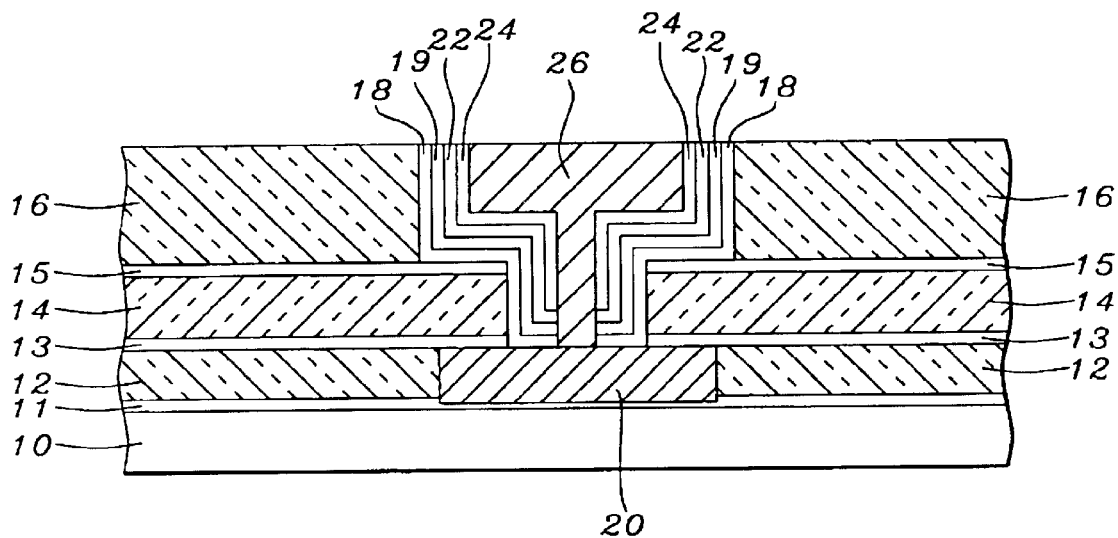
FIG. 7
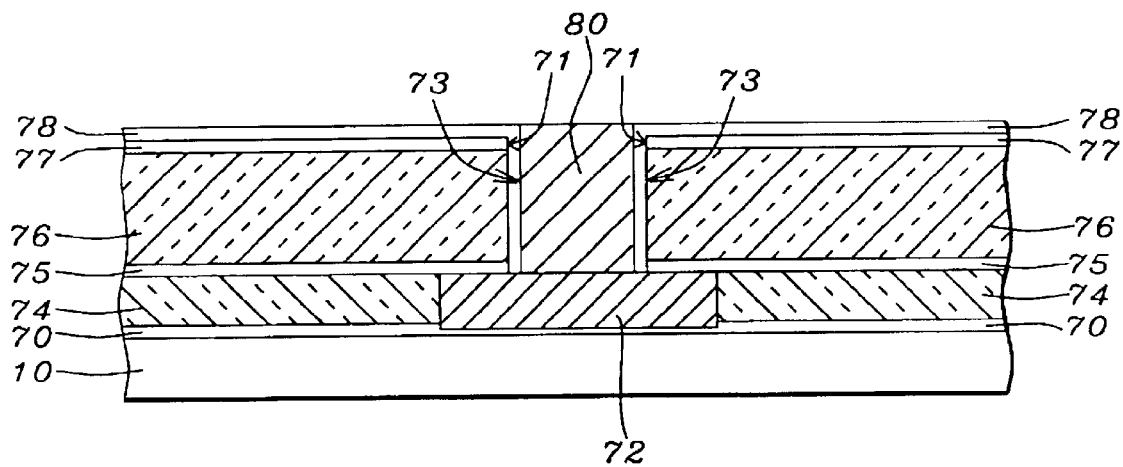
FIG. 8 – Prior Art

METHOD OF BARRIER-LESS INTEGRATION WITH COPPER ALLOY

RELATED PATENT APPLICATION

This application is related to Ser. No. 10/361,732 (TS01-1676) filed on Feb. 10, 2003, assigned to a common assignee.

BACKGROUND OF THE INVENTION

(1) Field of the Invention

The invention relates to the fabrication of integrated circuit devices, and more particularly, to a method and structure for the creation of a barrier-less layer of conductive interconnect.

(2) Description of the Prior Art

In the creation of semiconductor devices, the creation of conductive interconnects has become increasingly more important due to the continuing reduction in device parameters, a reduction that is driven by requirements of improved device performance. Metal is typically used for the creation of conductive interconnects comprising such materials as aluminum, tungsten, titanium copper polysilicon, polycide or alloys of these metal. For the creation of metal interconnects a Ti/TiN/AlCu/TiN process is the preferred method. Electrically conductive materials that can be used for the metal lines include but are not limited to Al, Ti, Ta, W, Mo, Cu, their alloys or a combination of these materials.

Due to increased requirements of low resistance of interconnect metal, copper has become more attractive as a material for the creation of interconnect metal. The invention relates to the fabrication of copper conductive lines and vias that provide the conductive interconnections of integrated circuits in semiconductor devices or the interconnections in a multilayer substrate over the surface of which semiconductor devices are mounted. More particularly, the invention relates to the fabrication of conductive lines and vias using damascene and dual damascene processes.

In fabricating Very and Ultra Large Scale Integration (VLSI and ULSI) circuits with the dual damascene process, an insulating or dielectric material, such as silicon oxide, of a semiconductor device is patterned with several thousand openings for the conductive lines and vias. These openings are filled at the same time with metal and serve to interconnect the active and passive elements of the integrated circuit. The dual damascene process is also used for forming multilevel conductive lines of metal, such as copper, in layers of insulating material, such as polyimide, of multi-layer substrates over which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. In the standard dual damascene process, the insulating layer is coated with a layer of photoresist, which is exposed through a first mask with an image pattern of via openings, the via pattern is anisotropically etched in the upper half of the insulating layer. The photoresist is then exposed through a second mask with an image pattern of the conductive line openings or trenches, after being aligned with the first mask of the via pattern to encompass the via openings. By anisotropically etching the openings for the conductive lines in the upper half of the insulating material, the via openings already present in the upper half of insulating material are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps.

Copper is being increasingly used as an interconnect metal due to its low cost and low resistivity. Copper however has a relatively large diffusion coefficient into surrounding dielectrics such as silicon dioxide and into silicon. Copper from an interconnect may diffuse into the silicon dioxide layer causing the dielectric to become conductive while decreasing the dielectric strength of the silicon dioxide layer. Copper interconnects are therefore typically encapsulated by at least one diffusion barrier, comprising for instance silicon nitride, to prevent diffusion into the silicon dioxide layer. Copper is known to have low adhesive strength to various insulating layers, masking and etching a blanket layer of copper layer continues to present a challenge.

To provide a starting material for electroplating of a copper interconnect line to the surrounding layer of dielectric or insulation, a seed layer is typically deposited over the barrier layer. The invention addresses this aspect of the creation of copper interconnects and provides a method that allows for the creation of such copper interconnects without the need for a separate barrier layer.

U.S. Pat. No. 5,913,144 (Nguyen, et al.) shows an oxidized diffusion barrier surface for the adherence of copper and method.

U.S. Pat. No. 6,218,734 B1 (Charneski, et al.) discloses a reactive plasma treatment to a diffusion barrier surface including $O_2$.

U.S. Pat. No. 6,365,506 B1 (Chang et al.), U.S. Pat. No. 6,043,148 (Peng et al.) and U.S. Pat. No. 6,309,970 B1 (Ito et al.) show damascene processes with barrier layers.

SUMMARY OF THE INVENTION

A principal objective of the invention is to create a barrier-less layer of copper interconnect.

Another objective of the invention is to create a layer of copper interconnect with improved adhesion of the copper in interfaces where the layer of copper is close to a surrounding etch stop layer.

Yet another objective of the invention is to create a barrier-less layer of copper interconnect of improved reliability.

Another objective of the invention is to create a layer of copper interconnect while avoiding voids in the copper where the layer of copper is close to a surrounding etch stop layer.

In accordance with the objectives of the invention a new method is provided for the creation of a barrier-free copper interconnect. A dual damascene structure is created in a layer of dielectric, a thin metal barrier layer is deposited. The metal barrier layer is oxidized, two layers are then deposited with the first layer comprising doped copper and the second layer comprising pure copper. The dual damascene structure is filled with copper, a thermal anneal is applied, stabilizing the deposited copper filling the dual damascene structure and forming metal oxide of the doped minority element. Excess copper is then removed from the dielectric.

BRIEF DESCRIPTION OF THE DRAWINGS

FIG. 7 shows a cross section after excess layers of material have been removed.

FIG. 8 shows a cross section of a prior art formation of a copper interconnect.

DESCRIPTION OF THE PREFERRED EMBODIMENTS

Figure 1:
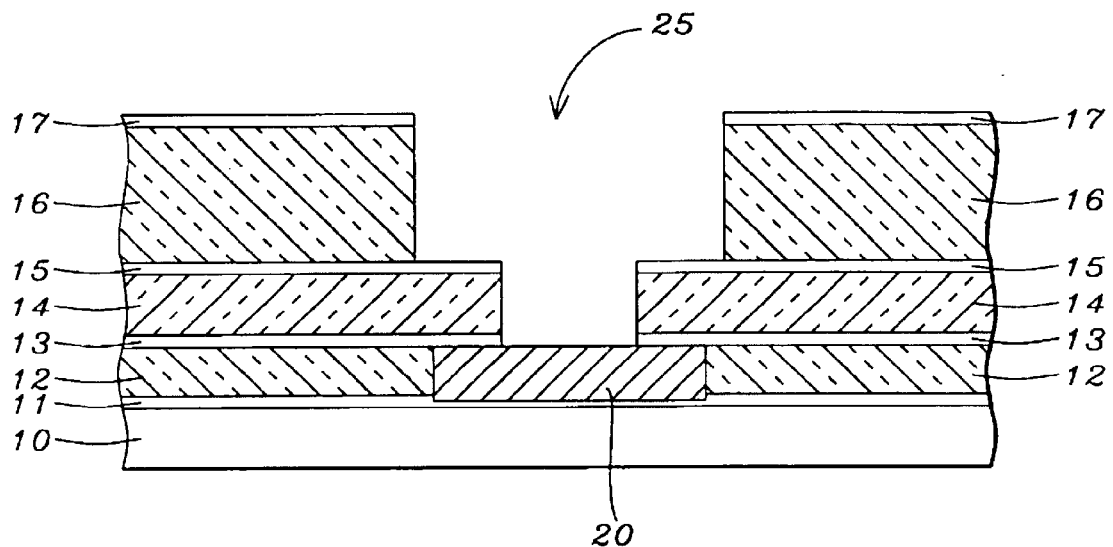
FIG. 1 shows a cross section of a semiconductor substrate over the surface of which a first level of metal is available, layers of dielectric have been deposited, an opening for a copper interconnect has been created through the multiple payers of dielectric. The created opening has the cross section of a dual damascene structure.

Current practices of creating barrier-free copper interconnects utilizes the separation of a minority element in doped copper, deposited over inside surfaces of an interconnect opening, at the interface between the doped copper and the surrounding dielectric. This separation stimulates oxidation of the separated minority element at the interface (between the layer of doped copper and the surrounding dielectric), forming a barrier layer against copper diffusion and a glue layer for copper adhesion.

The disadvantage of this conventional approach is that an etch stop layer, typically comprising SiN or SiC, cannot form metal oxide with the minority element of the doped copper, resulting in poor adhesion of the copper (in the interconnect opening) and the surrounding etch stop layer. The invention addresses this issue and provides a solution thereto.

The above-described approach is briefly highlighted using FIG. 8. Shown in FIG. 8 is a cross section of a semiconductor surface 10, typically the surface of a substrate, over the surface of which a point 72 of electrical contact has been provided. A metal interconnect is to be created aligned with the metal point of contact 72. Layer 70 is an etch stop layers as are layers 75 and 77. Layers 74 and 76 are overlying layers of dielectric through which an opening has been created first for the point of electrical contact 72 and then for the copper interconnect 80.

As stated above, prior art deposits a doped copper layer 78 over inside surfaces of the opening created through dielectric 76 and the etch stop layer 75. At the interface 73 between the doped copper layer 78 and dielectric 76 the minority elements of the doped copper layer 78 interface with the dielectric 76 and oxidizes, forming at that interface 73 a barrier/glue layer for copper interconnect 80. Interfaces 71 however are interfaces between the doped copper layer 78 and the etch stop layer 77 (typically of SiN or SiC), at which interfaces metal oxides cannot form due to the chemical composition of the etch stop layer 77. At these interfaces 71 therefore poor adhesion is present between the copper interconnect 80 and the etch stop layer 77. The invention addresses this problem.

The invention will now be described in detail using FIGS. 1 through 7 for this purpose.

Referring first specifically to FIG. 1, there is shown a cross section a layer 11, which represents the layer of semiconductor devices that is created in or over the surface of substrate 10. The electrical point of first level copper contact 20 is representative of the points of electrical contact in the surface of substrate 10 that provide access to the semiconductor devices created in or over the surface of substrate 10 as represented by layer 11.

Further shown in the cross section of FIG. 1 is a first layer 12 of dielectric, a second layer 14 of dielectric and a third layer 16 of dielectric. Overlying the three layers of dielectric are a first layer 13 of etch stop material, a second layer 15 of etch stop material and a third layer 17 of etch stop material. Opening 25, created through the layers of dielectric and etch stop material as shown in the cross section of FIG. 1, will be recognized as having the cross section of a dual damascene structure. Conventional methods of photolithographic exposure and development are used to create opening 25, opening 25 exposes the surface of copper contact point 20.

Layers 12, 14 and 16 of dielectric are preferably formed using a low-k dielectric material.

Figure 2:
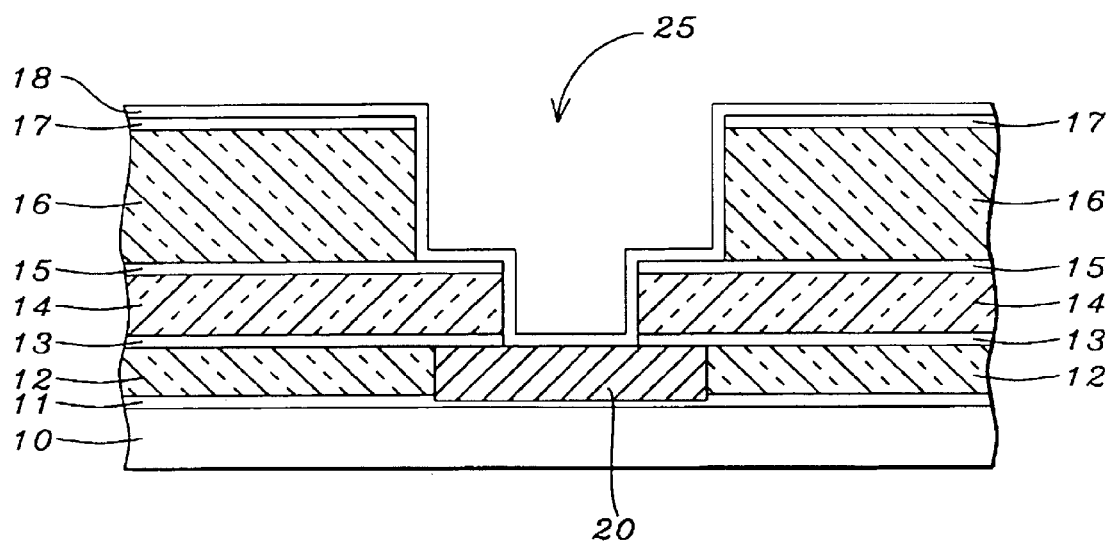
FIG. 2 is a cross section after deposition of a thin metal barrier layer.

As a next step, FIG. 2, a thin layer 18 of metal barrier material is deposited, using for instance methods of metal sputtering, over inside surfaces of opening 25 and over the surface of the patterned and etched layers of dielectric. The barrier layer 18 is preferably between about 30 and 150 Angstrom thick and more preferably about 100 Angstrom thick.

Barrier layer 18 can contain, without being limited thereto, Ti/TiN:W (titanium/titanium nitride:tungsten), titanium-tungsten/titanium or titanium-tungsten nitride/titanium or titanium nitride or titanium nitride/titanium, tungsten and tantalum. The preferred material of the invention for layer 18 comprises Ta or TaN or TiN.

Figure 3:
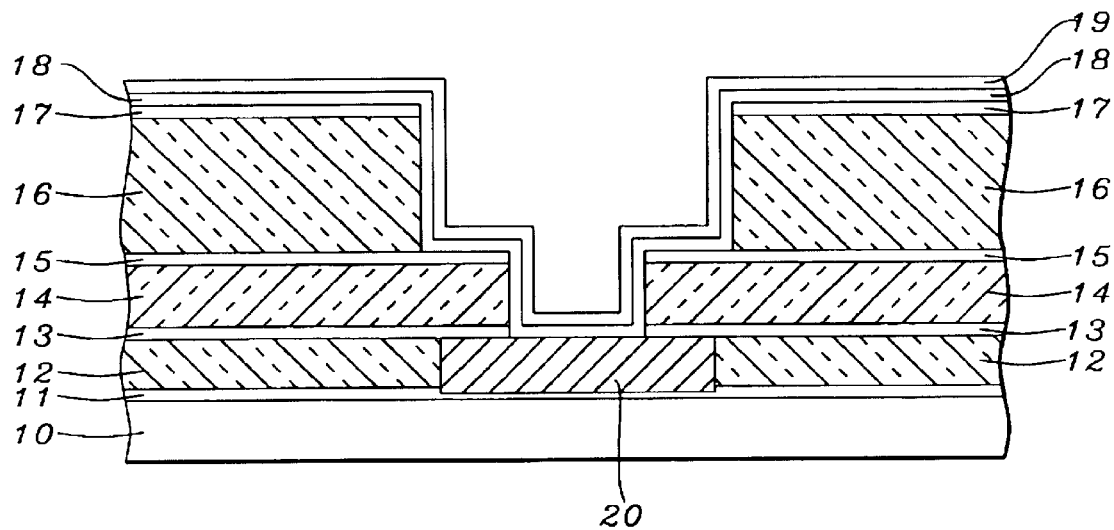
FIG. 3 is a cross section after the surface of the thin metal barrier layer has been oxidized.

Next, and as shown in the cross section of FIG. 3 and of prime significance to the invention, the metal barrier 18 is oxidized, creating an oxidized surface highlighted as layer 19 over the surface of layer 18. The oxidation of the exposed surface of the metal barrier layer 18 can be performed by for instance through a thermal oxidation method at a temperature of about 200 to 400 degrees C. for a time period of about 5 minutes to 20 minutes. The thickness of layer 19 of metal oxide must be adequate to form a reliable protective layer over the layer 18 of metal, a thickness of between about 20 and 100 Angstrom is preferred for layer 19 of metal oxide.

It must in the cross section that is shown in FIG. 3 be realized that the metal oxide layer 19 covers sidewalls of etch stop layer 17. These are the areas of concern that have previously been highlighted as surfaces 71 in FIG. 8. This layer 19 of metal oxide functionally replaces the oxide of the layers of dielectric, layer 76 in FIG. 8, in providing oxide for the formation of barrier/glue layers in the interface between a doped copper layer and a layer of oxide. This will be clearer in the following explanation.

Figure 4:
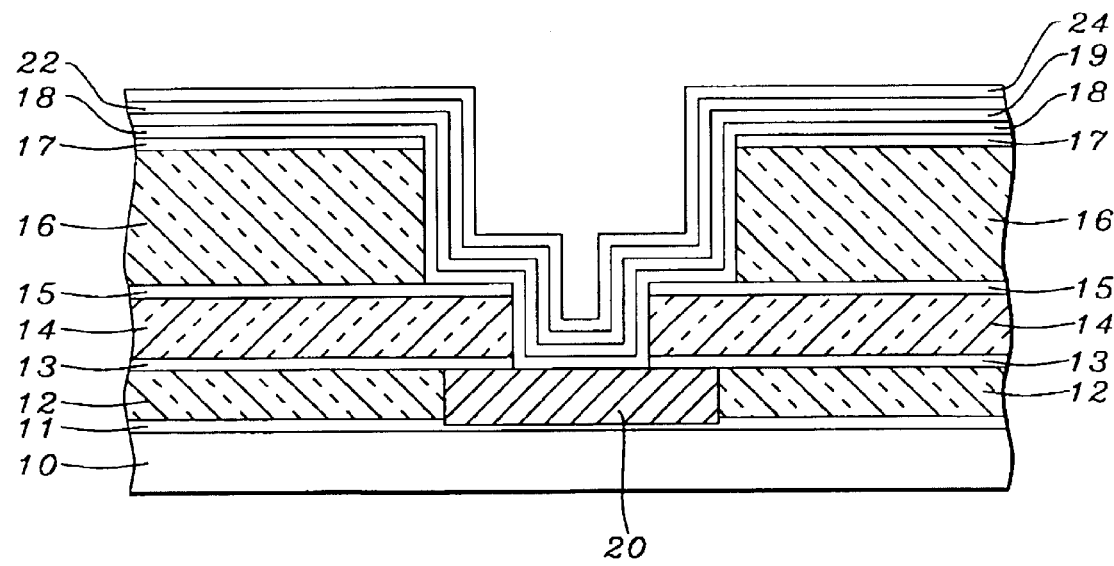
FIG. 4 is a cross section after successive deposition of a layer of doped copper and a layer of pure copper.

The invention continues, FIG. 4, with:
1. the deposition of a layer 22 of doped copper over which
2. a layer 24 of pure copper is deposited.

As a brief review, the overlying layers shown in the cross section of FIG. 4 are listed below:

layer 17, a layer of etch stop material layer 18, a layer of metal barrier material layer 19, a layer of metal oxide formed over the surface of the metal barrier layer 18 layer 22, a layer of doped copper, and layer 24, a layer of pure copper.

Layer 22 of doped copper may, herewith highlighting doping materials as examples without thereby being limited to these materials, be doped by Cr, Pd, Sn, Ti, Zr, Mg, Al. Layer 22 of doped copper may be deposited using methods of CVD or PVD, to a preferred thickness of between about 50 and 300 Angstrom.

Layer 24 of pure copper is preferably deposited to a thickness between about 300 and 1,000 Angstrom.

Basic to the invention is the observation that the oxygen of layer 19 reacts with the minority element of the doped copper layer 22, resulting in good adhesion and a high quality barrier layer.

Figure 5:
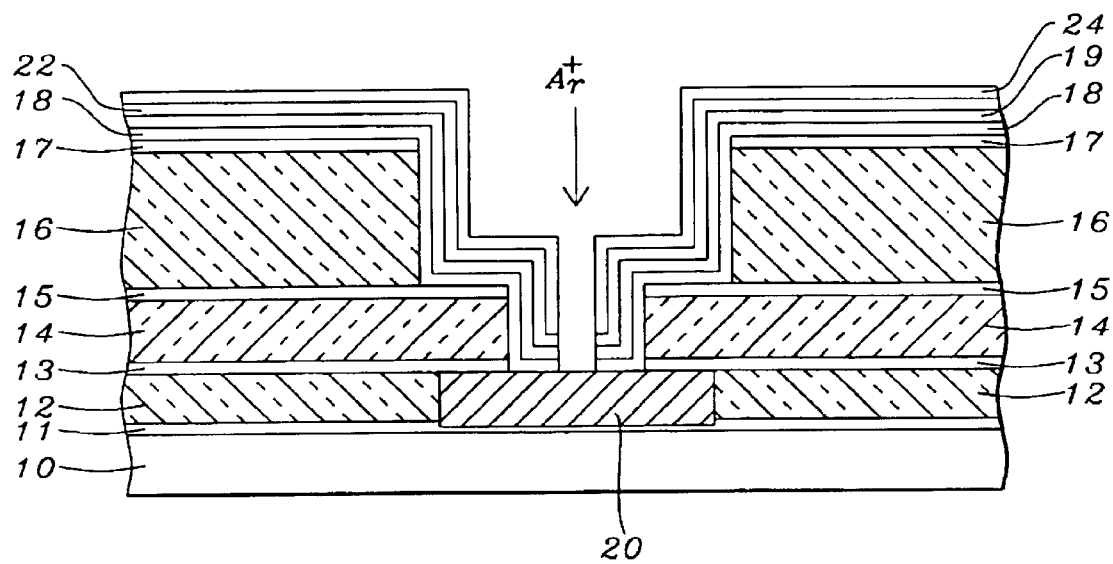
FIG. 5 is a cross section after deposited layers have been removed from the bottom of the opening.

For reasons of maintaining low contact resistance, the accumulated layers must now be removed from the bottom of opening 25, as shown in the cross section of FIG. 5. This step uses the "deposition and etch" concept wherein a plasma is applied comprising $Cu^0$, $Cu^+$ or $Cu^{++}$ as minority components, with relatively low concentrations of these components, combined with $Ar^+$ as majority-component, with relatively high concentration of this component.

During the deposition of layers 22 and 24, no or very low substrate bias is applied, during the application of the plasma etch a high substrate bias of about 500 to 1,000 Watts is applied resulting in the majority component $Ar^+$ of the plasma striking the layers over the bottom of opening 25 with considerable energy and therefore removing these layers from the bottom surface in an effective manner.

The results of this plasma treatment, for which the $Ar^+$ component is a major contributor, is shown in the cross-section of FIG. 5.

This latter concept can also be stated as follows: the lining of the sidewalls of the opening 25 with a compound layer comprises a first application of zero or about zero substrate bias during deposition of the layer 22 of doped copper and the layer 24 of Pure copper followed by a second application of a substrate bias of about 20 volts after the layer of doped copper and the layer of pure copper have been deposited, that is during the application of the plasma etch of the layer 22 of doped copper and the layer 24 of pure copper.

As an alternative to the steps that have been highlighted using FIGS. 3 and 4, which steps comprise a metal layer, oxidation of the metal layer and the successive deposition of a doped/pure layer of copper, after which all four components must be removed from the bottom of opening 25, these steps can be modified whereby the metal and metal oxide is removed from the bottom of opening 25 before the layers 22 and 24, of doped copper and copper are deposited.

For this alternate processing sequence (the same processing chamber that is used to deposit layer 18 of metal and to oxidize the surface of this layer creating layer 19) the deposition and etch sequence that has been described above can be applied to remove the at that time created layers 18 of metal barrier and 19 of metal oxide from the bottom of opening 25.

Figure 6:
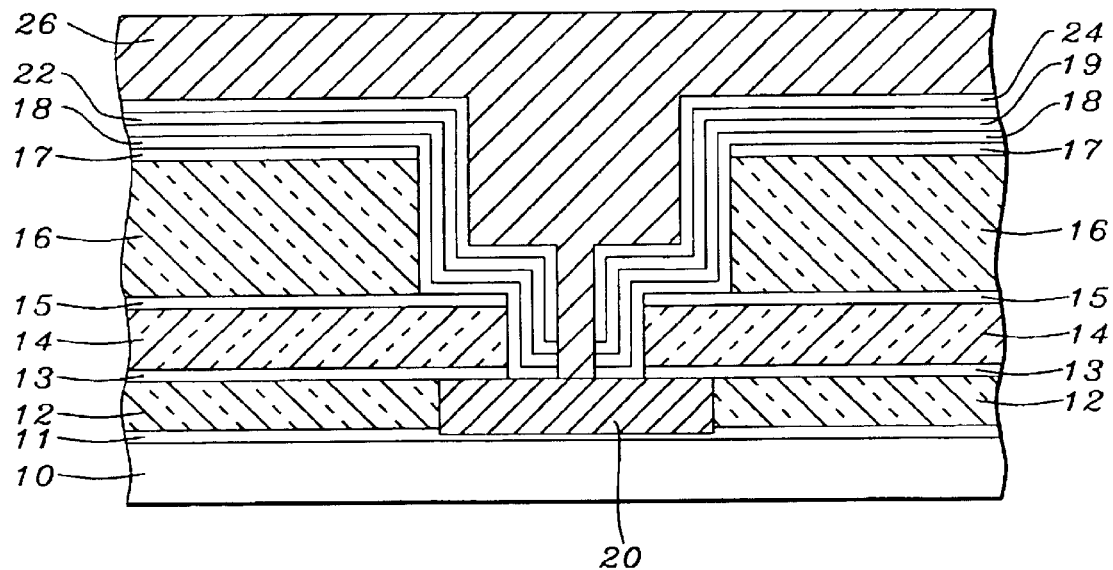
FIG. 6 is a cross-section after deposition of a layer of copper for formation of a copper interconnect.

The opening for the copper interconnect can now be filled with copper, FIG. 6, by depositing a layer 26 of copper over layer 24, filling opening 25.

After layer 26 has been deposited, preferably using methods of ECP, a Rapid Thermal Anneal (RTA) or hot plate or furnace is applied for the dual purpose of stabilizing the deposited layer 26 of copper and for the formation of metal oxide between the doped elements of layer 19 and the metal barrier layer 18. This metal oxide is therefore formed with a profile that is centered around the interface between layers 18 and 19, further enhancing the glue/barrier performance characteristics of the combined layers formed over inside surfaces of opening 25.

The Rapid Thermal Anneal, hot plate or furnace can be performed applying a temperature of no less than about 350 degrees C. for a time of no less than about 10 minutes.

By now, FIG. 7, removing excess material (layers 17–19, 22 and 24) from layer 16 of dielectric, a completed copper interconnect is obtained. The preferred method for this removed is the application of methods of Chemical Mechanical Polishing (CMP) even through the removal of these excess layers 17–19, 22 and 24 is not limited to the methods of CMP.

The invention can be summarized as follows:
providing a substrate, semiconductors having been provided in or over the substrate, at least one contact point of first level copper having been provided in or over the substrate a creating at least one interconnect opening through layers of semiconductor material over the substrate aligned with the at least one contact point depositing a thin layer of metal barrier material over the layers of semiconductor material, including insides surfaces of the at least one interconnect opening oxidizing the deposited thin layer of metal barrier material depositing a layer of doped over the oxidized surface of the thin layer of metal barrier material depositing a layer of pure copper over the doped copper removing layers of metal barrier material, the oxidized surface thereof, doped copper and pure copper from the bottom of the at least one interconnect opening by applying a deposit and etch concept depositing a layer of copper over the layer of pure copper, filling the at least one interconnect opening applying an anneal to the substrate and thereover created layers, and removing excess material from the layers of semiconductor material.

The layers of semiconductor material comprise layers of etch stop material and layers of low-k dielectric.

The deposit and etch concept comprises applying a plasma comprising $Cu^0$, $Cu^+$ or $Cu^{++}$ as minority components combined with $Ar^+$ as majority component, further comprising applying a zero or about zero substrate bias during the deposition of the layer of doped copper and the layer of pure copper followed by application of a substrate bias of about 500 to 1,000 Watts after the layer of doped copper and the layer of pure copper have been deposited.

The removing excess material from the layers of semiconductor material comprising methods of Chemical Mechanical Polishing (CMP) or surface etchback.

The interconnect openings having a profile selected from the group of profiles consisting of single damascene profile and a dual damascene profile and a contact opening profile and via opening profile.

Alternately, the invention can be summarized as follows:
providing a substrate, semiconductors having been provided in or over the substrate, at least one contact point of first level copper having been provided in or over the substrate creating at least one interconnect opening through layers of semiconductor material over the substrate aligned with the at least one contact point depositing a thin layer of metal barrier material over the layers of semiconductor material, including insides surfaces of the at least one interconnect opening oxidizing the deposited thin layer of metal barrier material removing layers of metal barrier material and the oxidized surface thereof from the bottom of the at least one interconnect opening by applying a deposit and etch concept depositing a layer of doped over the oxidized surface of the thin layer of metal barrier material depositing a layer of pure copper over the doped copper depositing a layer of copper over the layer of pure copper, filling the at least one interconnect opening applying an anneal to the substrate and thereover created layers, and removing excess material from the layers of semiconductor material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creation of a copper interconnect, comprising:
    providing a substrate, having one or more insulating layers formed thereover;
    creating an opening in said one or more insulating layers;
    lining sidewalls of the opening with a compound layer by applying methods of deposit and etch, said compound layer comprising:
        (i) a patterned layer of metal barrier material over the sidewalls, thereby including a layer of metal barrier material oxide created over the surface there-of, exposing a bottom surface of the opening;
        (ii) a patterned layer of doped copper over the layer of barrier material and the metal barrier material oxide layer; and
        (iii) a layer of pure copper over the layer of doped copper;
    filling the opening with copper; and
    applying an anneal to the substrate and the there-over created layers.

2. The method of claim 1, the one or more insulating layers comprising at least one layer of etch stop material and at least one layer of low-k dielectric.

3. The method of claim 1, the layer of metal barrier material oxide created over the surface there-of comprising in-situ oxidation of the layer of metal barrier material.

4. The method of claim 1, the methods of deposit and etch comprising applying a plasma comprising $Cu^0$, $Cu^+$ or $Cu^{++}$ as minority components combined with $Ar^+$ as majority component.

5. The method of claim 1, the lining sidewalls of the opening with a compound layer comprising a first application of zero or about zero substrate bias during deposition of the layer of doped copper and the layer of pure copper followed by a second application of a substrate bias of about 20 volts after the layer of doped copper and the layer of pure copper have been deposited.

6. The method of claim 1, the filling the opening with copper comprising methods of metal deposition followed by removing excess metal from the layers of semiconductor material.

7. The method of claim 6, the removing excess metal from the layers of semiconductor material comprising methods of Chemical Mechanical Polishing (CMP) or surface etchback.

8. The method of claim 1, the lining sidewalls of the opening with a compound layer comprising:
    depositing a layer of metal barrier material over the one or more insulating layers, thereby including inside surfaces of the opening created in the one or more insulating layers;
    oxidizing the layer of metal barrier material;
    first patterning the deposited layer of metal barrier material and the oxidized surface thereof, first removing said deposited layer of barrier material and the oxidized surface thereof from a bottom surface of said opening;
    depositing a layer of doped copper over the first patterned layer of barrier material and the oxidized surface thereof;
    depositing a layer of pure copper over the layer of doped copper; and
    second patterning the deposited layer of doped copper and the layer of pure copper, second removing said layer of doped copper and the layer of pure copper from a bottom surface of said opening.

9. The method of claim 8, the first patterning the deposited layer of metal barrier material and the oxidized surface thereof comprising applying a plasma comprising $Cu^0$, $Cu^+$ or $Cu^{++}$ as minority components combined with $Ar^+$ as majority component to the deposited layer of doped copper and the layer of pure copper.

10. The method of claim 8, the first patterning the deposited layer of metal barrier material and the oxidized surface thereof further comprising a first application of zero or about zero substrate bias during a first phase of the first patterning of the deposited layer of metal barrier material and the oxidized surface thereof followed by a second application of a substrate bias of about 500 to 1,000 Watts during a second phase of the first patterning of the deposited layer of metal barrier material and the oxidized surface thereof.

11. The method of claim 1, the opening having a single damascene profile, a dual damascene profile, a contact opening profile or a via opening profile.

12. A method for the creation of a copper interconnect, comprising:
    providing a substrate, having one or more insulating layers formed thereover;
    creating an opening in said one or more insulating layers;
    depositing a layer of metal barrier material over the one or more insulating layers, including insides surfaces of the opening;
    oxidizing the deposited layer of metal barrier material;
    depositing a layer of doped copper over the oxidized layer of metal barrier material;
    depositing a layer of pure copper over the doped copper;
    removing layers of metal barrier material, the oxidized surface thereof, the doped copper and the pure copper from the bottom of the opening by applying a deposit and etch concept;
    depositing a layer of copper over the layer of pure copper, filling the opening;
    applying an anneal to the substrate and thereover created layers; and
    removing excess material from the one or more layers of insulating.

13. The method of claim 12, the one or more insulating layers comprising a layer of etch stop material and a layer of low-k dielectric.

14. The method of claim 12, the layer of metal barrier material being Ta, TaN or TiN.

15. The method of claim 12, the doped copper comprising a doping element selected from the group consisting of Cr, Pd, Sn, Ti, Zr, Mg or Al.

16. The method of claim 12, the doped copper layer being deposited to a thickness of between about 50 and 300 Angstrom.

17. The method of claim 12, the layer of metal barrier material layer being deposited to a thickness of between 30 and 150 Angstrom.

18. The method of claim 12, the pure copper layer being deposited to a thickness of between about 300 and 1,000 Angstrom.

19. The method of claim 12, the applying a deposit and etch concept comprising applying a plasma comprising $Cu^0$, $Cu^+$ or $Cu^{30+}$ as minority components combined with $Ar^+$ as majority component, further comprising applying a zero or about zero substrate bias during a first phase of the etch followed by application of a substrate bias of about 500 to 1,000 Watts during a second phase of the etch.

20. The method of claim 12, the removing excess material from the layers of semiconductor material comprising methods of Chemical Mechanical Polishing (CMP) or surface etchback.

21. The method of claim 12, the opening having a single damascene profile, a dual damascene profile, a contact opening profile or a via opening profile.

22. A method for the creation of a copper interconnect, comprising:

providing a substrate, having one or more insulating layers formed thereover;

creating an opening in said one or more insulating layers;

depositing a layer of metal barrier material over the one or more insulating layers;

oxidizing the deposited layer of metal barrier material;

removing layers of metal barrier material and the oxidized surface thereof from a bottom of the opening by applying a deposit and etch concept;

depositing a layer of doped copper over the oxidized layer of metal barrier material;

depositing a layer of pure copper over the doped copper;

depositing a layer of copper over the layer of pure copper, filling the opening;

applying an anneal to the substrate and thereover created layers; and removing excess material from the one or more insulating layers.

23. The method of claim 22, the one or more insulating layers comprising at least one layer of etch stop material and at least one layer of low-k dielectric.

24. The method of claim 22, the layer of metal barrier material being Ta, TaN or TiN.

25. The method of claim 22, the doped copper comprising a doping element selected from the group consisting of Cr, Pd, Sn, Ti, Zr, Mg or Al.

26. The method of claim 22, the doped copper layer being deposited to a thickness of between about 50 and 300 Angstrom.

27. The method of claim 22, the layer of metal barrier material layer being deposited to a thickness of between 30 and 150 Angstrom.

28. The method of claim 22, the pure copper layer being deposited to a thickness of between about 300 and 1,000 Angstrom.

29. The method of claim 22, the applying a deposit and etch concept comprising applying a plasma comprising $Cu^0$, $Cu^+$ or $Cu^{++}$ as minority components combined with $Ar^+$ as majority component.

30. The method of claim 29 further comprising applying a zero or about zero substrate bias during a first phase of applying the plasma followed by application of a substrate bias of about 20 volts bias during a second phase of applying the plasma.

31. The method of claim 22, the removing excess material from the layers of semiconductor material comprising methods of Chemical Mechanical Polishing (CMP) or surface etchback.

32. The method of claim 22, the opening having a single damascene profile, a dual damascene profile, a contact opening profile or a via opening profile.

* * * * *